United States Patent
Nightingale (10) Patent No.: US 7,099,813 B2
(45) Date of Patent: Aug. 29, 2006

(54) SIMULATING PROGRAM INSTRUCTION EXECUTION AND HARDWARE DEVICE OPERATION

(75) Inventor: Andrew Mark Nightingale, Cambridge (GB)

(73) Assignee: ARM Limited, Cambridge (GB)

( * ) Notice: Subject to any disclaimer, the term of this patent is extended or adjusted under 35 U.S.C. 154(b) by 716 days.

(21) Appl. No.: 10/118,427

(22) Filed: Apr. 9, 2002

(65) Prior Publication Data
US 2003/0191616 A1    Oct. 9, 2003

(51) Int. Cl.
G06F 9/44        (2006.01)
G06F 13/10       (2006.01)

(52) U.S. Cl. ........................................................ 703/20

(58) Field of Classification Search ................ 714/724, 714/39; 716/5, 4, 18; 703/1–28
See application file for complete search history.

(56) References Cited

U.S. PATENT DOCUMENTS

| | | | | |
|---|---|---|---|---|
| 5,710,934 | A * | 1/1998 | Bona et al. .................. | 714/724 |
| 5,991,533 | A * | 11/1999 | Sano et al. .................... | 703/28 |
| 6,002,861 | A * | 12/1999 | Butts et al. .................... | 703/16 |
| 6,006,028 | A * | 12/1999 | Aharon et al. ................. | 703/21 |
| 6,134,516 | A * | 10/2000 | Wang et al. ................... | 703/27 |
| 6,295,623 | B1 * | 9/2001 | Lesmeister et al. .......... | 714/741 |
| 6,678,645 | B1 | 1/2004 | Rajsuman et al. | |
| 2001/0042226 | A1 * | 11/2001 | Dzoba et al. .................. | 714/39 |
| 2002/0002698 | A1 * | 1/2002 | Hekmatpour ................... | 716/4 |
| 2002/0019969 | A1 * | 2/2002 | Hellestrand et al. ........... | 716/5 |
| 2002/0040288 | A1 * | 4/2002 | Yamoto et al. ................ | 703/17 |
| 2002/0042897 | A1 * | 4/2002 | Klein et al. .................. | 714/718 |
| 2002/0111783 | A1 * | 8/2002 | Kodosky et al. .............. | 703/13 |
| 2002/0133325 | A1 * | 9/2002 | Hoare et al. ................... | 703/17 |
| 2003/0131325 | A1 * | 7/2003 | Schubert et al. ............... | 716/4 |
| 2003/0149962 | A1 * | 8/2003 | Willis et al. ................. | 717/135 |
| 2003/0182642 | A1 * | 9/2003 | Schubert et al. ............... | 716/4 |
| 2003/0200515 | A1 * | 10/2003 | Ly et al. ......................... | 716/5 |
| 2004/0025122 | A1 * | 2/2004 | Schubert et al. ............... | 716/4 |
| 2004/0250231 | A1 * | 12/2004 | Killian et al. .................. | 716/18 |
| 2005/0076314 | A1 * | 4/2005 | Matsui et al. ................... | 716/1 |
| 2005/0100032 | A1 * | 5/2005 | Patiejunas .................... | 370/410 |
| 2005/0125754 | A1 * | 6/2005 | Schubert et al. ............... | 716/5 |
| 2005/0143630 | A1 * | 6/2005 | Darby et al. ................. | 600/300 |
| 2005/0143968 | A9 * | 6/2005 | Odom et al. .................. | 703/21 |
| 2005/0144577 | A1 * | 6/2005 | Devins et al. .................. | 716/5 |
| 2005/0149898 | A1 * | 7/2005 | Hakewill et al. ............. | 716/18 |
| 2005/0193280 | A1 * | 9/2005 | Schubert et al. ............... | 714/47 |

\* cited by examiner

Primary Examiner—Kamini Shah
Assistant Examiner—Cuong Van Luu
(74) Attorney, Agent, or Firm—Nixon & Vanderhye P.C.

(57) ABSTRACT

A simulation system is provided for simulating operation of a plurality of hardware devices in combination with an instruction set simulator simulating execution of program instructions by a program core. A test scenario manager acts as a master and serves to command the hardware devices and the instruction set simulator with stimulus signals to simulate various specified activity.

20 Claims, 4 Drawing Sheets

SIMULATING PROGRAM INSTRUCTION EXECUTION AND HARDWARE DEVICE OPERATION

BACKGROUND OF THE INVENTION

1. Field of the Invention

This invention relates to the field of data processing systems. More particularly, this invention relates to the simulation of systems including a processor core and a plurality of hardware devices.

2. Description of the Prior Art

The ability to effectively and efficiently test and/or validate designs is becoming increasingly important. Typical data processing system designs are rapidly increasing in complexity and furthermore are including circuit blocks designed by a variety of different sources or companies. So called system-on-chip (SoC) designs that integrate a large number of functional elements on a single integrated circuit have strong advantages in terms of cost and performance, but require significant amounts of validation and testing before the designs can be reliably released for manufacture. This validation and testing requirement is becoming a bottleneck in getting new systems into the market place. Consequently, measures that can improve the efficiency and effectiveness of such validation and testing of designs are strongly advantageous.

There are currently 3 approaches that can be used to validate a SoC design:
(a) Build a software model of the design and run the same software when the hardware is complete. The problems here include that the hardware models are not fully represented in software in that there is no hardware feedback loop such that different hardware block models can interact fully.
(b) Build VHDL and/or Verilog (trickboxes) models to plug into the external interfaces of the SoC blocks to provide external stimulus to the SoC. This approach is commonly used but suffers from the problem that the code is not very re-usable, and a large amount of knowledge is required of the operation of each trickbox to create effective tests.
(c) Build models of each of the blocks (eVCs) in the SoC using an HVL (hardware verification language) such a Specman to replace existing hardware blocks in turn, such that the modelled blocks can provide stimulus into the system. Here a problem is that the integrity of the system is compromised as existing blocks need to be removed and re-inserted per test.

The copending U.S. patent application U.S. Ser. No. 09/994,023 filed on 27 Nov. 2001 with the same inventor and Assignee as the current application describes a mechanism for the coordinated validation of hardware devices. The disclosure of this earlier copending application is incorporated herein in its entirety by reference.

The copending U.S. patent application entitled "Software and Hardware Simulation" filed on 22 Feb. 2002 describes a mechanism for testing software drivers and their associated hardware. The disclosure of this earlier copending application is incorporated herein in its entirety by reference.

SUMMARY OF THE INVENTION

As well as simulating the behaviour of hardware devices, such as peripherals and interfaces, it is desirable to also be able to simulate and/or validate the behaviour of software executing on a processor core. In normal operation of the real system the program instructions executing on the processor core typically have control and authority over the system as a whole and direct its operation following the program instruction sequence. It is known to provide instruction set simulators which allow execution of program instructions by a processor core to be simulated, but it is currently not practical to bring such instruction execution simulation meaningfully together with hardware device simulation in an efficient manner. Whilst it may be possible to allow an instruction set simulation to steadily simulate execution of a stream of program instructions whilst a hardware simulation operates in parallel to simulate the action of hardware surrounding the processor core, the interaction between the hardware simulation and instruction execution simulation is substantially unmanaged and relies upon quasi-random occurrence of combinations of state in order to test the range of operational state of the system as a whole. This is highly time consuming and in many cases not practical due to the relatively slow speed at which hardware devices may be accurately and reliably simulated.

Viewed from one aspect the present invention provides apparatus for simulating data processing operations performed by a data processing apparatus, said data processing apparatus including a processor core operable to execute program instructions and a plurality of hardware devices coupled to said processor core, said apparatus comprising:

a hardware simulator operable to simulate said plurality of said hardware devices, said hardware simulator being responsive to one or more stimulus signals to generate one or more response signals simulating a response of one or more of said plurality of hardware devices to said one or more stimulus signals if applied to one or more of said plurality of hardware devices;

an instruction set simulator operable to simulate said processor core, said instruction set simulator being responsive to one or more stimulus signals to simulate execution of one or more program instructions by said processor core and to generate one or more response signals simulating a response of said processor core if said one or more program instructions were executed by said processor core;

a test scenario manager coupled to said hardware simulator and said instruction set simulator and operable to generate said stimulus signals supplied to said hardware simulator and said instruction set simulator such that said test scenario manager acts as a master to command simulation operations performed by said hardware simulator and said instruction set simulator in accordance with predetermined test scenario parameters.

The invention recognises that whilst in the real physical device the processor core may generally act as the master and command the rest of the system in its operation, during simulation the hardware simulator and the instruction set simulator may usefully both be treated as slaves to a test scenario manager. In this way, the test scenario manager may command the instruction set simulator to execute particular program instruction sequences or fragments which it is desired to simulate in combination with particular sets of stimulus signals being applied to the plurality of hardware devices that in the real system are coupled to the processor core. Surprisingly, this provides an effective and time efficient test and validation technique whereby the interaction of the processor core executing program instructions with the hardware devices associated with the core may be accurately simulated and the simulation directed at particular coordinated states of circumstances/state of the system. This arrangement reverses the normal situation in which the processor core is the master and instead makes the processor core a slave that is commanded by the test scenario manager.

In particularly preferred embodiments the test scenario parameters specify an interleaved sequence of stimuli to be applied to the hardware simulator and the instruction set simulator. The ability to interleave simulation signals in such a predetermined manner is highly effective in identifying and diagnosing potential problems with a system design.

It will be appreciated that the test scenario manager needs some mechanism by which to communicate with the instruction set simulator. In preferred embodiments of the invention a software signal interface controller to provide such a communication mechanism is embodied in the form of software executed by the instruction set simulator itself. This is an efficient and flexible way of achieving communication between the test scenario manager and the instruction set simulator.

A preferred mechanism for passing information between the test scenario manager and the instruction set simulator is via a shared memory. Such a mechanism is advantageously easy to provide and manage.

The instruction set simulator may utilise the shared memory in a variety of different ways. Preferred ways in which the instruction set simulator may read the shared memory include the shared memory being one or more of:

a debug interface register of said processor core simulated by said instruction set simulator;

a memory location accessible to said processor core simulated by said instruction set simulator;

an interrupt signal store operable to latch interrupt signals applied to said processor core simulated by said instruction set simulator; and a command memory operable to store commands to said instruction set simulator.

Whilst it will be appreciated that the test scenario parameters could be essentially random parameters seeking to explore a wide span of system state of the system being validated, in preferred embodiments the test scenario parameters are a user specified subset of stimulus signals. In practice, a user of the validation system will often be able to identify ranges of stimulus signals which are likely to be of particular interest and towards which the validation and verification efforts of a product development cycle should be directed. In this context the user may specify the subset of stimulus signals to be applied in a particular set and vary this between sets to explore what are envisaged to be potentially problematic situations.

One particular type of problematic situation which the present technique is well suited to investigate are ones aimed at simulating time critical real time operational scenarios involving the interaction of the processor core operating under program instruction control with various hardware devices. An example of such a situation would be whether or not a FIFO was being emptied quickly enough by an associated hardware device whilst it was being filled at its maximum rate by software executing on the processing core.

The present technique is also well suited to allow a user to specify a subset of stimulus signals which can be used to establish performance limitations (e.g. speed, bandwidth etc) of a system under test prior to the real system becoming available.

The advantages of the coordinated approach to test and validation provided by the present technique and the ability to include within this the processor core executing program instructions are particular evident in circumstances such as when an interaction between a first hardware device and the processor core is being simulated and then an interruption to this interaction is simulated as being generated by a second hardware device. The ability of this system as a whole to cope with such real life potentially problematic situations is important to accurately test whilst at a simulation and validation stage.

The interaction between a processor core executing program instructions and an associated hardware device is particular important to test in the circumstance of the program instructions forming part of a software driver for the hardware device in question. This type of interaction is particular well suited to the command driven type testing provided by this technique in that the test scenario manager may trigger particular device driver software to be run applying predetermined stimuli to an associated hardware device and checking for an appropriate response.

The communication provided by use of the shared memory advantageously provides a degree of independence from the particular simulation environment used for the hardware simulation (e.g. the hardware could be simulated in Verilog, VHDL or a mixture thereof).

Viewed from another aspect the present invention provides a method of simulating data processing operations performed by a data processing apparatus, said data processing apparatus including a processor core operable to execute program instructions and a plurality of hardware devices coupled to said processor core, said method comprising the steps of:

in response to one or more stimulus signals, simulating said plurality of said hardware devices and generating one or more response signals simulating a response of one or more of said plurality of hardware devices to said one or more stimulus signals if applied to one or more of said plurality of hardware devices;

in response to one or more stimulus signals, simulating execution of one or more program instructions by said processor core and generating one or more response signals simulating a response of said processor core if said one or more program instructions were executed by said processor core;

using a test scenario manager to generate said stimulus signals such that said test scenario manager acts as a master to command simulation operations to simulate both said plurality of hardware devices and said processor core in accordance with predetermined test scenario parameters.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
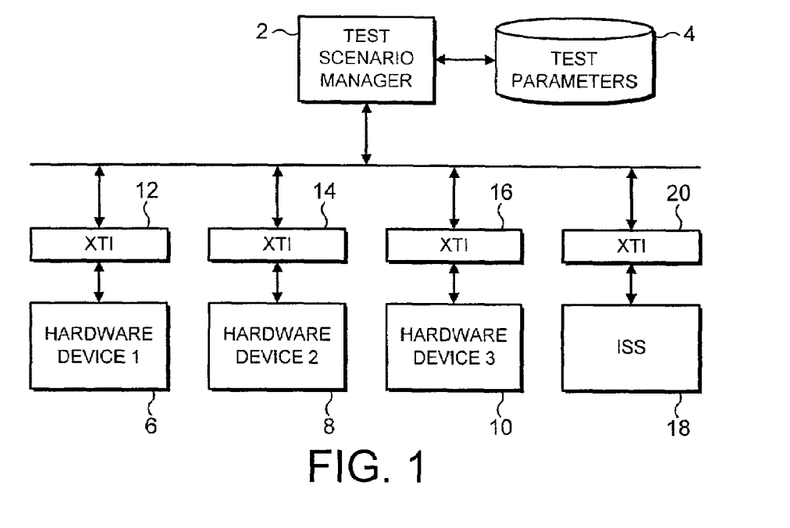
FIG. 1 schematically illustrates a simulation environment including a plurality of hardware devices and an instruction set simulator.

FIG. 1 schematically illustrates a simulation system comprising a test scenario manager 2 utilising user specified predetermined test scenario parameter data 4 to apply stimulus signals to a plurality of hardware devices 6, 8, 10 via test interfaces 12, 14, 16. Responses of the hardware devices 6, 8, 10 are also returned and observed via the test interfaces 12, 14, 16.

An instruction set simulator 18 is provided to simulate the operation of a processor core acting under control of program instructions. The instruction set simulator also has a test interface 20 via which it can receive stimulus signals from the test scenario manager 2 and through which it may return results.

The test scenario manager 2 acts as a master device in this arrangement whereby it issues commands (stimulus signals) to the various hardware devices 6, 8, 10 or the instruction set simulator 18. Details of the messaging mechanisms used for communicating between the test scenario manager 2 and various hardware devices 6, 8, 10 may be found in the copending U.S. patent application Ser. No. 09/994,023 referred to above and incorporated herein by reference. The present technique extends this communication to also encompass the instruction set simulator 18 via its test interface 20. Thus, the instruction set simulator may be commanded by the test scenario manager 2 to execute particular program instructions or sequences of program instructions as required. The instruction set simulator will act to generate appropriate response signals that would be generated by the processor core executing such program instructions and the instruction set simulator can be responsive to the state of one or more of the other hardware devices 6, 8, 10 within the system being simulated.

Figure 2:
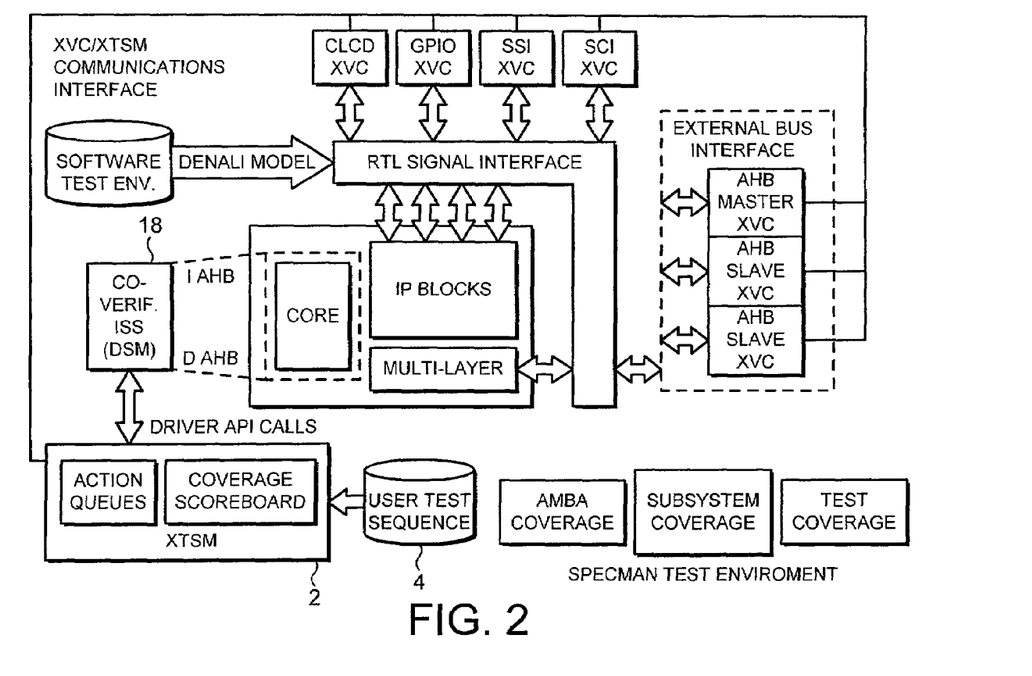
FIG. 2 schematically illustrates a more complex simulation environment including a plurality of hardware devices and an instruction set simulator.

FIG. 2 schematically illustrates a more complex system comprising a processor core and a plurality of hardware devices which it is desired to simulate. The simulation system still includes the test scenario manager 2 and the test parameters 4 together with the instruction set simulator 18. Further elements corresponding to hardware devices being simulated and the driving of external busses are also included. It will be seen that the test scenario manager 2 is connected so as to be able to command execution of program instructions by the instruction set simulator 18 as well as being able to apply stimulus signals to the various hardware device simulations and recover response data from both the hardware device simulations and the instruction set simulator. The various hardware device simulations and the instruction set simulator may also exchange data directly between one another as required in accordance with the system being simulated.

Figure 3:
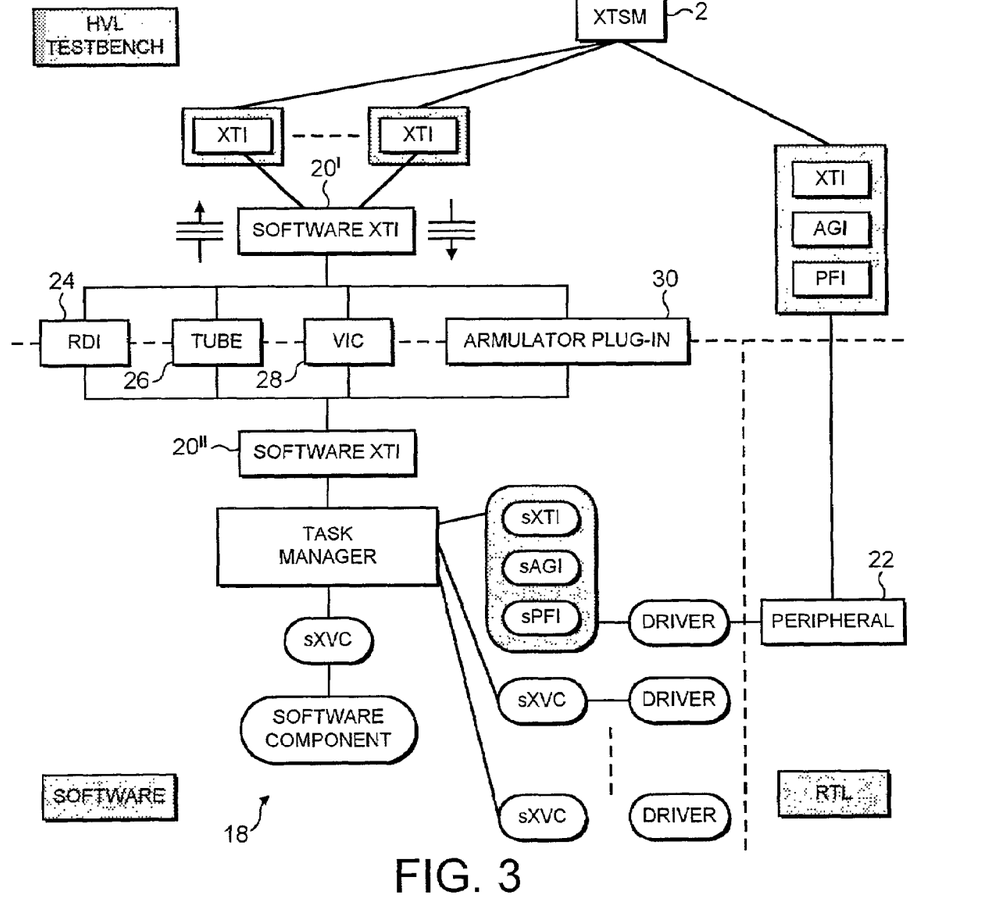
FIG. 3 schematically illustrates an instruction set simulator and its communication mechanism with a test scenario manager.

FIG. 3 schematically illustrates the instruction set simulator in more detail. The test scenario manager 2 communicates via its test interfaces with hardware devices 22 as well as with the instruction set simulator 18. A test interface 20/ is provided to identify messages issued by the test scenario manager 2 that are intended for the instruction set simulator 18 and make the appropriate writes to shared memory that can then be read by the instruction set simulator 18. This portion of the test interface 20/ is provided on the simulation environment side as software that is part of the test bench being used. Four different types of shared memory 24, 26, 28, 30 are illustrated in FIG. 3, although in practice these may be common physical memory locations and what differs is the way in which the test interface 20// within the instruction set simulator 18 chooses to interpret the data stored in that shared memory location. The test interface 20// is provided in the form of software which is executed by the instruction set simulator 18 itself and accordingly is loaded into the instruction set simulator as the simulation system is booted up. This test interface 20// together with a cut down version of an operating system that seeks to provide execution support for a plurality of different program instruction code fragments that may execute on the processor core simulation is also provided. If processing resources allow, then a full version of a real operating system could be used, but in practice it is found that a simpler cut down version is all that is required.

More particularly, FIG. 3 shows the proposed structure for the software XTI interface (external test interface). On the testbench side the XTSM 2 interfaces with an e language XVC (external verification controller) stub. This provides an XVC id which is then used to communicate through the software XTI to the nominated software XVC. The software XTI can be configured to use any one of the proposed communication technologies.

On the software side, the C++ half of the software XTI communicates with the software XVCs through a Task Manager.

The Task Manager's main responsibility is the scheduling of the software XVCs. This could be a simple pre-emptive scheduler with fixed time-slots and stacks for each of the XVCs. Interrupts and driver call-backs could be implemented as system events that can trigger other XVC actions.

XTI Command Interface

References [3] to [6] below give background information regarding each of the XTI communications channels that may be available to pass data from the hardware (RTL) environment into the software domain. Data is passed to and from the software domain using these channels. The data is formatted in such a way as to facilitate the following command set from and to the XTSM XTI interface. An XVC overview including the XTI can be found in ISB02-GENC-000365 (Reference [1]):

This XTI interface holds state and control information about the external model, and is responsible for receiving and executing action requests from the XTSM. This interface component initiates and monitors the execution progress of the current action, and informs the external model scenario manager that it is ready for the next action. Command packets received from the XTSM would have a format similar to that shown below:

```
1. Action Count
1a. Action ID
2a. Action Parameter Data Block  ⎫  Repeated for ea
3a. Action Trigger Event ID       ⎭
```

The action parameter data block above in field 2a. of the above will take the form of a linked list of structures, each structure containing a scalar value of relevance to its associated Action ID to be processed. Return status information from the XTI is encoded in a single status structure:

```
1. Device ID
2. Current Action ID
3. Current Action Status
4. Action Trigger Event ID
5. Last Error code
```

-continued

| 6. Message text |
|---|

The XTI is also responsible for receiving action synchronisation events, and generating status events such that the status structure can be read from the XTSM. Some typical events passed in and out of the software domain XTI are listed in the table below:

| Event | Direction | Comments |
|---|---|---|
| Trigger event ID fired | In | A system event has been detected, XTI to Check ID |
| Stop Run | In | Suspend action processing |
| Action Complete | Out | Current Action completed XTSM to read status |
| Action Sequence Complete | Out | Current list of Actions completed XTSM to read status |
| Device Error Detected | Out | I/O Error/Timeout detected XTSM to read status |
| Message Waiting | Out | Annotation text available XTSM to read status |

REFERENCES

[1] Andy Nightingale "PrimeXsys Validation Architecture" ISB02-GENC-000365

[2] Alistair Bruce, John Goodenough "Re-useable Hardware/Software Co-verification of IP Blocks" $14^{th}$ IEEE ASIC/SOC Conference, September 2001.

[3] RDI 1.5 Implementation: ARM document references for the remote debug interface (RDI) applications programming interface (API) are as follows:

RDI-0003-CUST-ESPC-B RDI 1.5

RDI-0005-CUST-ESPC-B RDI 1.5 terms and abbreviations

RDI-0008-CUST-ESPC-B RDI 1.5/1.0 Protocol converter

RDI-0013-CUST-ESPC-B RDI 1.5.1 changes from 1.5

RDI-0014-CUST-ESPC-A Remote_A RDI usage

RDI-0015-CUST-ESPC-A Multi-ICE RDI usage

RDI-0016-CUST-ESPC-A ARMulator RDI usage

RDI-0044-PRIV-ESPC-A01 RDI for NDI

RDI-0047-PRIV-ESPC-A02 RDI Self describing modules

The basic XTI data passing mechanism for RDI would be to monitor the XTSM/XTI interface for commands and generate a SWI on the core for external communications events. Data is passed back from the task manager via another SWI which is handled by the RDI/XTI interface and passed back to the XTSM/XTI. The SWI handlers would manage the data passing between interfaces.

[4] Tube/Internal Memory Implementation: As specified in ARM Document

ARM DDI 0243A-01 ARM ADK Technical Reference Manual

Section 5.4 describes the basic TUBE model. This implementation would require an enhancement such that the TUBE register could be written to via an external source and hence by the software task manager itself. Another variant on the TUBE that would not require modification would be the Internal Memory (IntMem) block documented in section 5.2 of ARM DDI 0243A-01. Both mechanisms would access as bidirectional data passing registers for XTI communication.

[5] VIC Implementation: The PrimeCell vectored interrupt controller (VIC) PL190 ARM document reference number is:

ARM DDI 0181C ARM PrimeCell PL190 Technical Reference Guide

Essentially command sequences using this implementation would be presented via the 32 external interrupt lines from the XTSM/XTI and would be read and translated via the task manager. Being unidirectional however, feedback would be required by some other mechanism such as reference [4] above.

[6] ARMulator plug-in implementation: ARM document references for the ARMulator applications programming interface (API) are as follows:

ARM DAI 0032E Application note 32: The ARMulator appnote32_RevE.zip: Example ARMulator custom models Using a similar mechanism to that of the RDI above, an ARMulator plug-in would be developed to interface to the XTSM/XTI and pass communications down through an ARMulator plug-in XTI to the software task manager. Communications would be driven by the use of SWI calls. The SWI handlers would manage the data passing between interfaces. The model used would be that of an operating system interface, documented in section 2.4 of the above application note document.

The above mentioned references are documents that are all publicly available, e.g. from ARM Limited, Cambridge, England.

Figure 4:
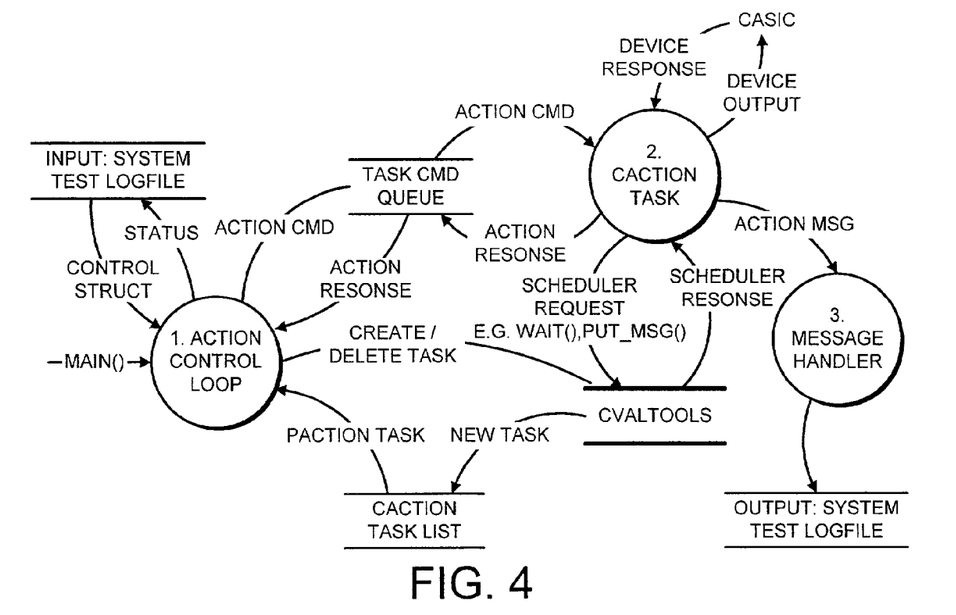
FIG. 4 schematically illustrates the control flow within the instruction set simulator.

FIG. 4 is a diagram showing the expanded software driver test coordinating process which waits for commands received via the system test control interface. On initialisation the action control loop 1 calls the scheduler implemented as a set of method calls in a CValTools to create a set of action tasks. The number and type of action tasks are defined by the user. Each action task has its own command loop and executes on a "tick" call basis. In one allocated tick, it must process any commands in its command queue before returning from the call back.

The tick for each task is driven by the CValTools class that operates under a timer interrupt. The CValTools also provides a set of methods such as:

ptcc=peek_msg( )

post_msg(ptcc)

ptcc=get_msg( )

wait(ticks)

abort(error_level)

Each of the above commands will have use of appropriate structures.

Figure 5:
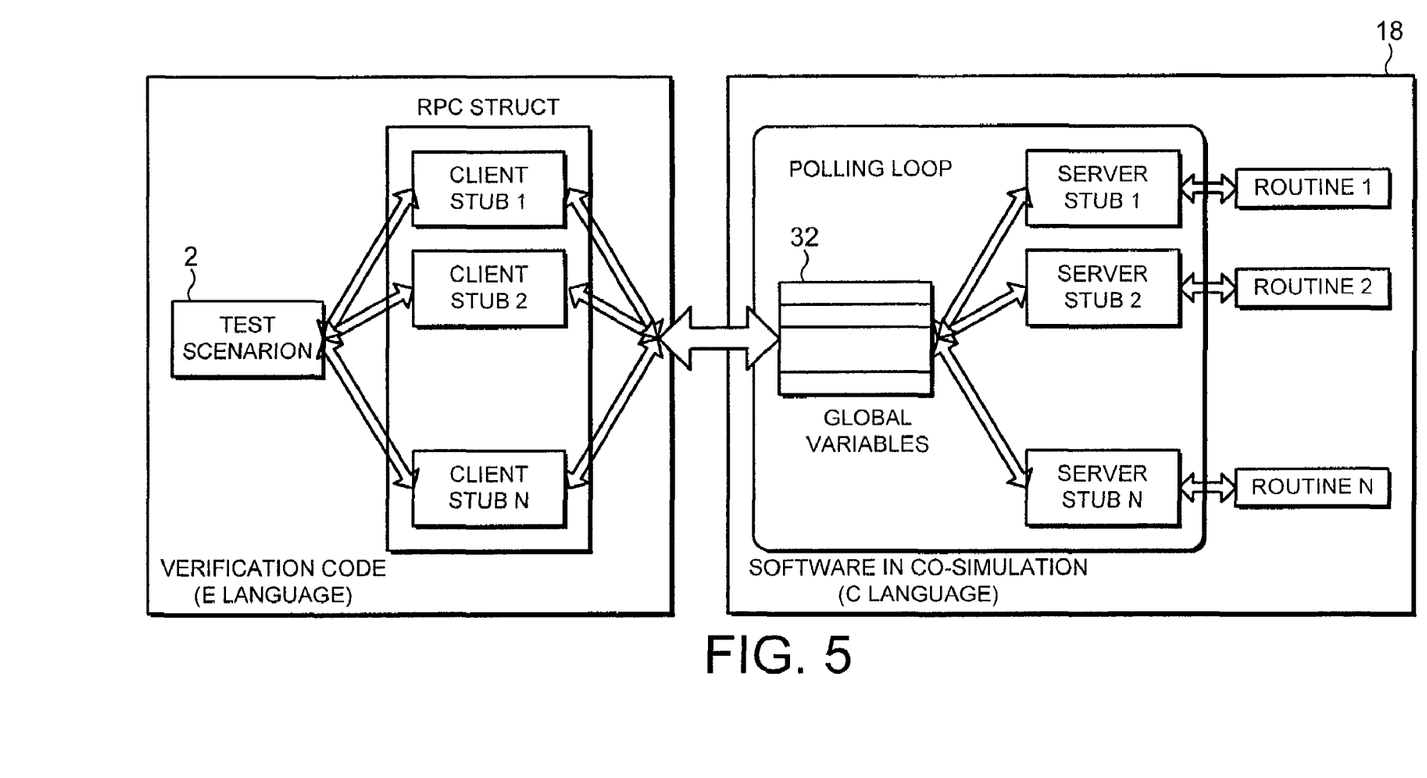
FIG. 5 schematically illustrates the use of a shared memory for exchanging information between a test scenario manager and an instruction set simulator.

FIG. 5 is a schematic illustration of the way in which data may be passed from the test scenario manager 2 to the instruction set simulator 18 via a shared memory 32. On the test scenario manager side the verification code includes a plurality of client stubs which serve to write data values into the shared memory 32 as commanded by the test scenario manager 2. A polling loop operable on the software side for the instruction set simulator 18 polls the shared memory 32 and reads the data written therein passing this to the appropriate server stub code within the instruction set simulator and then onto the appropriate routine that will service the stimulus that has been specified by the data passed. The shared memory 32 may correspond to any of the elements 24, 26, 28 or 30 from FIG. 3.

Figure 6:
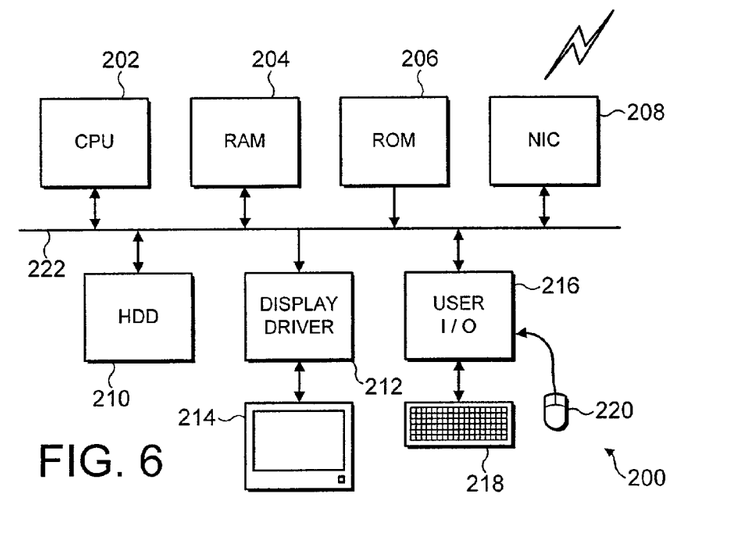
FIG. 6 schematically illustrates the architecture of a general purpose computer that may be used to perform the simulation techniques discussed above.

FIG. 6 schematically illustrates a general purpose computer 200 of the type that may be used to implement the above described techniques. The general purpose computer 200 includes a central processing unit 202, a random access memory 204, a read only memory 206, a network interface card 208, a hard disk drive 210, a display driver 212 and monitor 214 and a user input/output circuit 216 with a keyboard 218 and mouse 220 all connected via a common bus 222. In operation the central processing unit 202 will execute computer program instructions that may be stored in one or more of the random access memory 204, the read only memory 206 and the hard disk drive 210 or dynamically downloaded via the network interface card 208. The results of the processing performed may be displayed to a user via the display driver 212 and the monitor 214. User inputs for controlling the operation of the general purpose computer 200 may be received via the user input output circuit 216 from the keyboard 218 or the mouse 220. It will be appreciated that the computer program could be written in a variety of different computer languages. The computer program may be stored and distributed on a recording medium or dynamically downloaded to the general purpose computer 200. When operating under control of an appropriate computer program, the general purpose computer 200 can perform the above described techniques and can be considered to form an apparatus for performing the above described technique. The architecture of the general purpose computer 200 could vary considerably and FIG. 6 is only one example.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for simulating data processing operations performed by a data processing apparatus, said data processing apparatus including a processor core operable to execute program instructions and a plurality of hardware devices coupled to said processor core, said apparatus comprising:
   a hardware simulator operable to simulate said plurality of said hardware devices, said hardware simulator being responsive to one or more stimulus signals to generate one or more response signals simulating a response of one or more of said plurality of hardware devices to said one or more stimulus signals if applied to one or more of said plurality of hardware devices;
   an instruction set simulator operable to simulate said processor core, said instruction set simulator being responsive to one or more stimulus signals to simulate execution of one or more program instructions by said processor core and to generate one or more response signals simulating a response of said processor core if said one or more program instructions were executed by said processor core;
   a test scenario manager coupled to said hardware simulator and said instruction set simulator and operable to generate said stimulus signals supplied to said hardware simulator and said instruction set simulator such that said test scenario manager acts as a master to command simulation operations performed by said hardware simulator and said instruction set simulator in accordance with predetermined test scenario parameters, wherein said test scenario parameters specify an interleaved sequence of stimulus signals to be applied by said hardware simulator and said instruction set simulator.

2. Apparatus as claimed in claim 1, wherein test scenario manager controls said instruction set simulator by a software signal interface controller provided as software executed by said instruction set simulator.

3. Apparatus as claimed in claim 2, wherein said software signal interface controller receives stimulus signals from said test scenario manager using a shared memory into which said test scenario manager may write data and from which said software signal interface controller may read data.

4. Apparatus as claimed in claim 3, wherein said shared memory is read by said instruction set simulator as being one or more of:
   a debug interface register of said processor core simulated by said instruction set simulator;
   a memory location accessible to said processor core simulated by said instruction set simulator;
   an interrupt signal store operable to latch interrupt signals applied to said processor core simulated by said instruction set simulator; and
   a command memory operable to store commands to said instruction set simulator.

5. Apparatus as claimed in claim 1, wherein said predetermined test scenario parameters are a user specified subset of stimulus signals.

6. Apparatus as claimed in claim 5, wherein said user specified subset of stimulus signals are directed to simulate a time critical real time operational scenario.

7. Apparatus as claimed in claim 5, wherein said user specified subset of stimulus signals are directed to establish performance limitations of said data processing apparatus.

8. Apparatus as claimed in claim 1, wherein said test scenario manager is operable to stimulate an interruption of interaction between a first hardware device and said processor core executing program instruction relating to said first hardware device with an interrupt generated by a second hardware device.

9. Apparatus as claimed in claim 1, wherein said program instructions being simulated by said instruction set simulator are at least part of a software driver for controlling a hardware device being simulated by said hardware simulator.

10. Apparatus as claimed in claim 3, wherein communication of said test scenario manager with said hardware simulator via said shared memory provides independence of said instruction set simulator and said test scenario manager from a hardware simulation environment used by said hardware simulator.

11. A method of simulating data processing operations performed by a data processing apparatus, said data processing apparatus including a processor core operable to execute program instructions and a plurality of hardware devices coupled to said processor core, said method comprising the steps of:
   in response to one or more stimulus signals, simulating said plurality of said hardware devices and generating one or more response signals simulating a response of one or more of said plurality of hardware devices to said one or more stimulus signals if applied to one or more of said plurality of hardware devices;
   in response to one or more stimulus signals, simulating execution of one or more program instructions by said processor core and generating one or more response signals simulating a response of said processor core if said one or more program instructions were executed by said processor core;

using a test scenario manager to generate said stimulus signals such that said test scenario manager acts as a master to command simulation operations to simulate both said plurality of hardware devices and said processor core in accordance with predetermined test scenario parameters, wherein said test scenario parameters specify an interleaved sequence of stimulus signals to be applied in simulating said plurality of said hardware devices and simulating execution of one or more program instructions by said processor core.

12. Method as claimed in claim 11, wherein test scenario manager controls said instruction set simulator by a software signal interface controller provided as software executed by an instruction set simulator which also simulates execution of said program instructions by said processor core.

13. Method as claimed in claim 12, wherein said software signal interface controller receives stimulus signals from said test scenario manager using a shared memory into which said test scenario manager may write data and from which said software signal interface controller may read data.

14. Method as claimed in claim 13, wherein said shared memory is read by said instruction set simulator as being one or more of:
 a debug interface register of said processor core simulated by said instruction set simulator;
 a memory location accessible to said processor core simulated by said instruction set simulator;
 an interrupt signal store operable to latch interrupt signals applied to said processor core simulated by said instruction set simulator; and
 a command memory operable to store commands to said instruction set simulator.

15. Method as claimed in claim 11, wherein said predetermined test scenario parameters are a user specified subset of stimulus signals.

16. Method as claimed in claim 15, wherein said user specified subset of stimulus signals are directed to simulate a time critical real time operational scenario.

17. Method as claimed in claim 15, wherein said user specified subset of stimulus signals are directed to establish performance limitations of said data processing apparatus.

18. Method as claimed in claim 11, wherein said test scenario manager is operable to stimulate an interruption of interaction between a first hardware device and said processor core executing program instruction relating to said first hardware device with an interrupt generated by a second hardware device.

19. Method as claimed in claim 11, wherein said program instructions being simulated are at least part of a software driver for controlling a hardware device being simulated.

20. Method as claimed in claim 13, wherein communication of said test scenario manager via said shared memory provides independence of said instruction set simulator and said test scenario manager from a hardware simulation environment used to simulate said plurality of hardware devices.

* * * * *